United States Patent
Sopkin

(12) 
(10) Patent No.: US 6,405,333 B1
(45) Date of Patent: Jun. 11, 2002

(54) FAIL ARRAY MEMORY CONTROL CIRCUIT WITH SELECTIVE INPUT DISABLE

(75) Inventor: Bill Sopkin, Oxnard, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/282,224

(22) Filed: Mar. 31, 1999

(51) Int. Cl.[7] .............................................. G01R 31/28
(52) U.S. Cl. ...................................... 714/724; 714/734
(58) Field of Search ................................. 365/200, 201; 714/719, 711, 724, 734, 702; 377/55

(56) References Cited

U.S. PATENT DOCUMENTS

| 3,962,687 A | * | 6/1976 | Suzumura et al. | ........... 365/200 |
| 4,369,511 A | * | 1/1983 | Kimura et al. | ............... 714/719 |
| 4,460,999 A | * | 7/1984 | Schmidt | ...................... 714/711 |
| 4,550,387 A | * | 10/1985 | Takita | .......................... 377/55 |
| 5,216,673 A | * | 6/1993 | Kanai | .......................... 714/719 |
| 5,410,687 A | * | 4/1995 | Fujisaki et al. | ............. 365/201 |
| 5,610,925 A | * | 3/1997 | Takahashi | .................... 714/724 |

OTHER PUBLICATIONS

Teradyne Marlin Memory Tester Digital Block Diagram dated Nov. 1994, channel card portion.

* cited by examiner

*Primary Examiner*—David Ton
(74) *Attorney, Agent, or Firm*—Lance M. Kreisman

(57) ABSTRACT

A memory control circuit is disclosed for use in a data path of a failure capture circuit to selectively control the storage of failure information associated with a pin of a device-under-test. The memory control circuit includes a memory controller operative to generate a store signal in response to a failure control signal and a semiconductor memory having a control input coupled to the controller for receiving the store signal. The memory controller operates in response to the store signal to write failure information associated with a particular failure control signal. Disable logic in the memory control circuit is operative according to predetermined conditions for selectively inhibiting the delivery of the failure control signals to the memory controller.

14 Claims, 2 Drawing Sheets

FAIL ARRAY MEMORY CONTROL CIRCUIT WITH SELECTIVE INPUT DISABLE

FIELD OF THE INVENTION

The invention relates generally to automatic test equipment for testing semiconductor devices, and more particularly a fail array memory control circuit with a selective input disable apparatus for use in a semiconductor tester to test semiconductor devices.

BACKGROUND OF THE INVENTION

Semiconductor device fabrication involves numerous complex processes that include not only actual fabrication steps, but also verification steps to ensure the acceptability of the fabrication steps. One of the more important verification processes includes testing each device with automatic test equipment to verify operability according to expected electrical parameters. The testing is usually carried out at both the wafer and packaged-device levels to maximize wafer yields.

Automatic test equipment, individually referred to as a tester, comprises a sophisticated computer-controlled system that generally stimulates selected pins of a device-under-test (DUT) with input signals, or vectors, and captures the responsive DUT outputs for comparison to expected DUT outputs. The capture and comparison is generally carried out by failure analysis circuitry. If the captured signals match the expected signals under various conditions, the DUT continues through the fabrication process. Should the comparison identify inconsistent results, the tester processes information concerning the fault in the failure analysis circuitry for subsequent evaluation by the semiconductor manufacturer. In circumstances where consistent failures in multiple DUTs are observed, the failure analysis becomes critically important in determining why the failures are being caused.

Conventional failure analysis circuitry in a tester typically includes several data storage elements for storing failure-related data. One such element comprises a failure capture memory, or catchram, that stores fail information in address locations corresponding to the address locations of a failed memory cell in the DUT. The catchram allows the tester to provide a bit image representation of the failed DUT. Information relating to the individual failures, such as the pattern state, and the address and data bits associated with the failed memory cell location, are stored in a memory element often referred to as the fail vector memory (FVM) or history RAM.

Conventional FVM's are typically fairly wide in order to store the entire state of the machine, but have a relatively small overall storage capacity, anywhere from about 256 to 1024 locations deep. Failures detected from the individual pins of the DUT are processed as sync-reject signals, and ORed to form a failure control signal bitstream. The bitstream feeds an FVM controller that issues write commands to the FVM for each sync-reject signal received.

In response to the FVM controller, the FVM loads into each location in the memory information associated with each individual failure. The information is received from data source inputs regarding a particular cycle of pattern information relating to an individual failure, such as subroutine vector address, subroutine vector accumulator value, cycle counter value, and as noted above, address and data bits. With such information, a subsequent evaluation of a DUT failure is relatively straightforward. One example of a failure analysis circuit consistent with the above description is found in the Marlin Memory Tester, manufactured by Teradyne, Inc., Agoura Hills, Calif.

One of the problems that conventional FVM configurations often encounter involves unexpected large streams of failures resulting from faulty sync-reject channels, or a large number of failures occurring due to high performance testing. In such circumstances, conventional FVM circuits often become overwhelmed by the data, causing the memory to fill quickly and in some circumstances, wrap around. This often results in an undesirable loss of failure analysis data.

What is needed and heretofore unavailable is a failure vector memory circuit for use in a semiconductor tester that selectively disables individual channels to prevent the FVM from prematurely filling. The fail capture memory circuit of the present invention satisfies this need.

SUMMARY OF THE INVENTION

The fail array memory control circuit of the present invention provides a selective disable feature per device-under-test (DUT) pin that prevents a per-pin failure vector memory (FVM) from prematurely reaching capacity. As a result, more accurate failure data is retained concerning failures detected during a test while minimizing any loss of DUT failure data.

To realize the foregoing advantages, the invention in one form comprises a memory control circuit for use in a data path of a failure capture circuit to selectively control the storage of failure information associated with a pin of a device-under-test. The memory control circuit includes a memory controller operative to generate a store signal in response to a failure control signal and a semiconductor memory having a control input coupled to the controller for receiving the store signal. The memory controller operates in response to the store signal to write failure information associated with a particular failure control signal. Disable logic in the memory control circuit is operative according to predetermined conditions for selectively inhibiting the delivery of the failure control signals to the memory controller.

In another form, the invention comprises a failure capture circuit for use in a semiconductor tester for capturing and processing output signals generated by a device-under-test. The failure capture circuit includes capture logic for capturing output pin data from the device-under-test and fail array logic for processing the output pin data. The fail array logic includes a plurality of channels corresponding to the DUT pins. Each channel includes failure detection logic for identifying failures in the captured pin data and generating failure signals representing the identified failures. Per-pin memory is provided in the fail array logic for storing failure information associated with the identified failures and includes a control signal input. The fail array logic also includes disable logic coupled to the failure detection logic for selectively inhibiting propagation of the failure signals. A memory controller is coupled to the disable logic for generating store command signals to the memory control signal input in response to receiving failure signals selectively passed by the disable logic.

In a further form, the invention comprises a method of controlling the storage of failure information in a failure vector memory controlled by a memory controller responsive to failure control signals. The method includes the steps of: identifying failures relating to a pin of a device-under-test; generating failure control signals indicative of the detected failures; routing the failure control signals to the memory controller; and selectively disabling the routing step when the number of failure control signals reaches a predetermined level.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
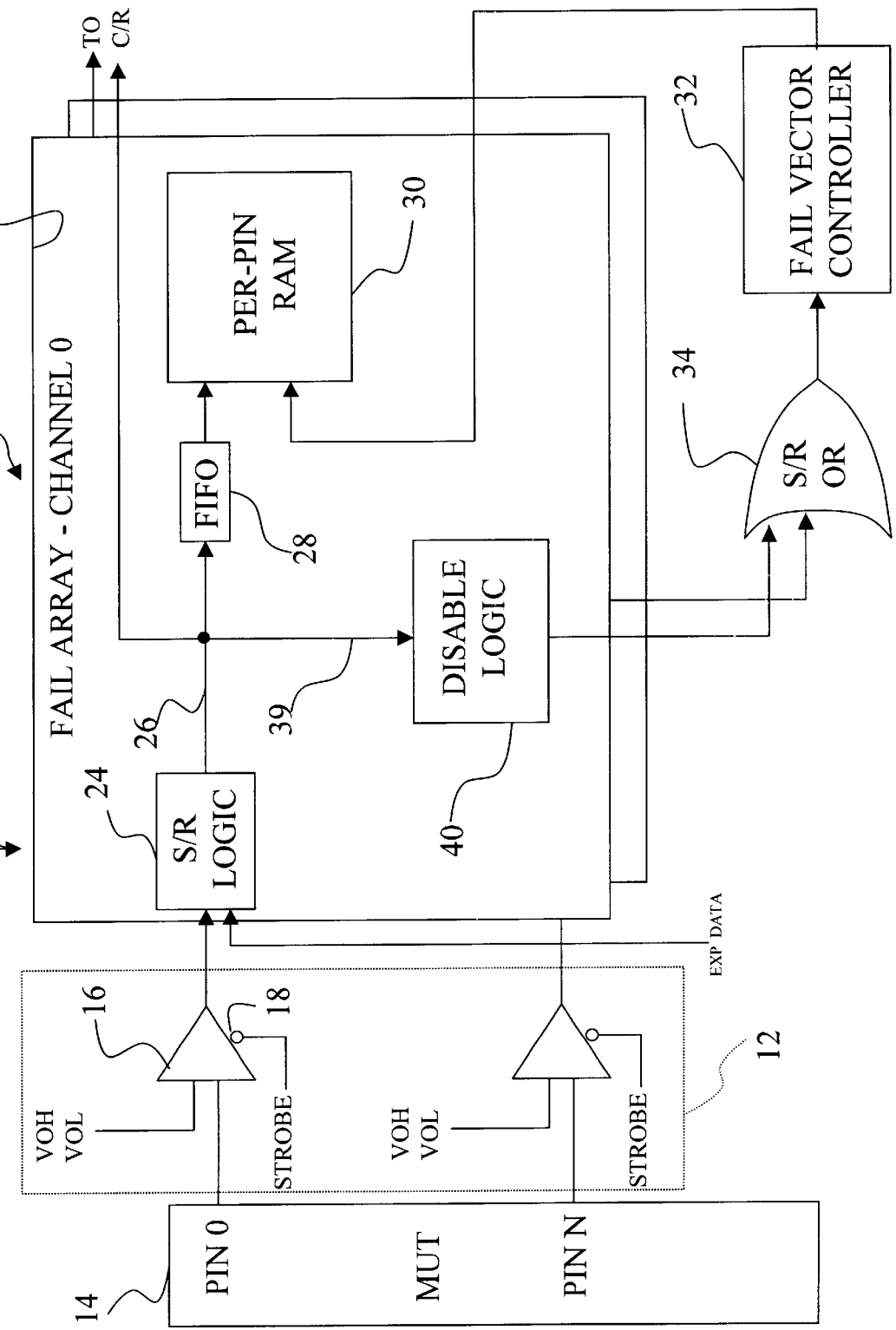
FIG. 1 is a block diagram of a failure vector memory circuit according to one embodiment of the present invention.

Referring now to FIG. 1, a failure capture circuit 10 for use in a semiconductor tester is shown. The circuit includes capture logic 12 for capturing output signals associated with a device-under-test (DUT) 14 and fail array logic 20. The fail array logic includes a plurality of fail array channels 22 for processing and routing individual DUT pin failure signals to a catchram circuit (not shown) and a per-pin failure vector memory (FVM) 30. Disable logic 40 selectively inhibits the flow of failure data to the per-pin memory. This allows for channel-to-channel control over the failure data being stored in the per-pin memory to prevent unexpected data overflows.

For purposes of clarity, the following description focuses on the structure of the invention as it relates to failure capture and processing for one pin of the DUT 14. It should be understood that the number of DUT pins for a single device ranges from a few pins upwards to several hundred pins.

Further referring to FIG. 1, the capture logic 12 comprises an array of comparators 16 that programmably correspond to selected pins of the DUT 14. Each comparator includes respective DUT pin and logic level (VOH, VOL) inputs as is well known in the art. A control input 18 receives strobe signals generated by a timing generator (not shown) for activating the comparator to carry out its capture function during a precisely timed "read" cycle.

The output of the comparator 16 feeds the fail array logic 20. The fail array logic is configured as a per-pin architecture that includes a plurality of channels 22 programmed to correspond to the DUT pins. FIG. 1 illustrates the fail array logic for channel 0 that, in this example, is programmed to process failure information for PIN 0 of the DUT 14.

The fail array logic 20 includes sync-reject logic 24 for receiving the comparator output and an expect data (EXP DATA) input. The output of the sync-reject logic defines a sync-reject channel 26 that routes the sync-reject signals to the catchram (not shown), a delay pipeline 28, and the disable logic 40 along a data path 39.

While not shown herein, one construction of a catchram circuit is more fully described in copending U.S. patent spplication Ser. No. 09/426,486, entitled "Failure Capture Apparatus and Method for Automatic Test Equipment", filed Oct. 26, 1999, assigned to the assignee of the present invention and expressly incorporated by reference herein.

Preferably the per-pin memory 30 resides in the fail array logic 20 and comprises a 3-bit portion of the overall FVM (not shown) for each location in the FVM. The three bits record a coded pass/fail state and channel state (high, low, midband, and glich in window). The rest of the FVM (not shown) includes a relatively wide input data width sufficient for recording the state of the entire tester. The depth of the FVM is between 256 to 2048 locations. Each location stores a data word having a data structure that includes, for example, bits that code the state of the pattern generator for that particular fail, the I/O channel state, the row, column and data bits for the failed DUT location, and so forth. Because of its relatively small capacity, the FVM is especially prone to filling should one of the sync-reject channels 26 transmit a disproportionately large number of failure control signals, or sync-rejects.

The per-pin memory 30 is controlled by an FVM controller 32 according to a plurality of store modes. The modes include, for example, "store all" (store all information), "store this vector" (store data relating only to a particular vector), and "store fails" (store failure data). The "store fails" mode causes the controller to issue store signals to the memory in response to a stream of sync-reject signals generated by other fail array channels, and collectively ORed by an OR gate 34. The inventor has discovered that in circumstances where the number of sync-reject signals are unusually high for a particular channel, the per-pin memory prematurely fills to capacity. This in turn causes the per-pin memory to wrap, resulting in an undesirable loss of failure data.

Figure 2:
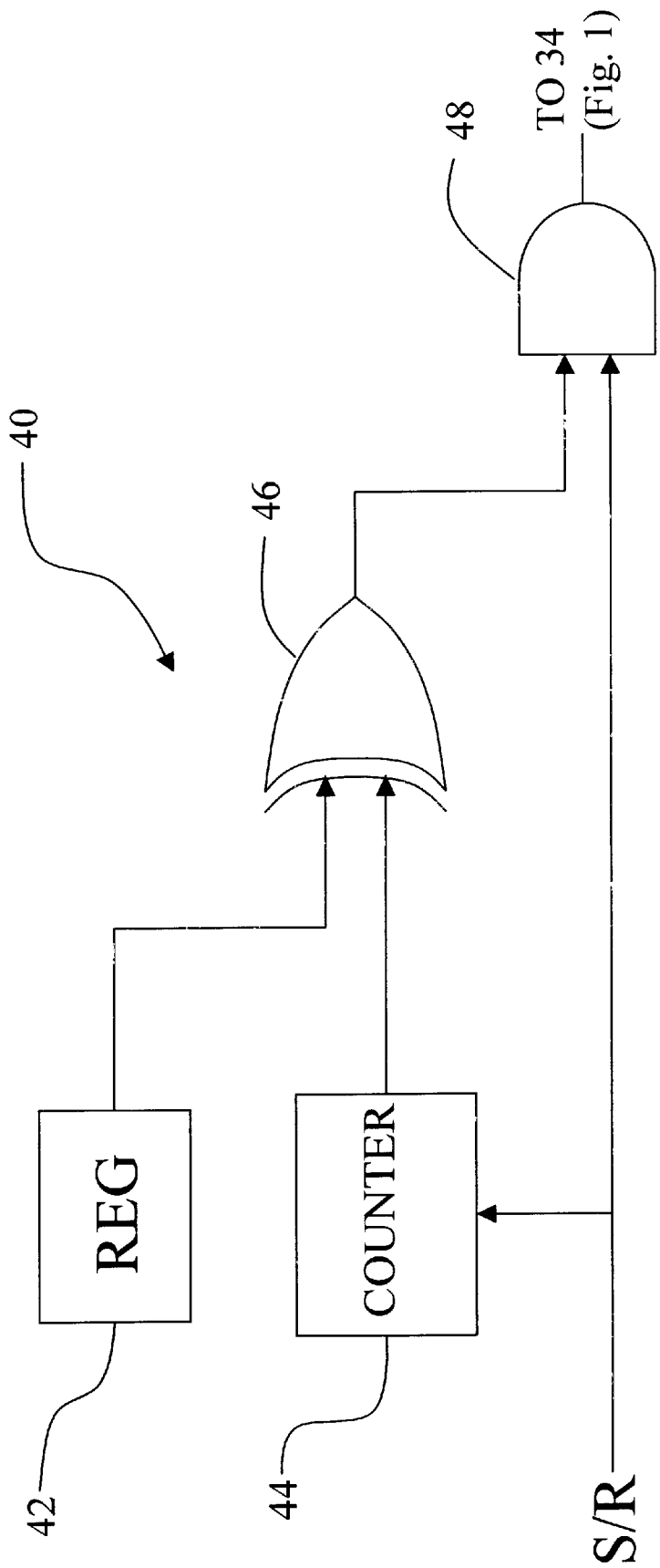
FIG. 2 is a block diagram of one embodiment of the disable logic shown in FIG. 1.

To minimize the risk of the per-pin FVM 30 prematurely filling, and referring now to FIG. 2, each sync-reject channel 26 of the fail array 20 employs the disable logic 40 to selectively disable the delivery of sync-reject signals into the OR gate 34 via that particular path. Each disable logic circuit preferably includes a programmable register 42 for storing a threshold value representing a predetermined number of allowed fails before the channel should be disabled, and a multi-bit counter 44 for maintaining a running count of the number of fails (sync-reject signals) transmitted along the channel. For applications where the FVM is, for example, 1024 locations deep, a counter having anywhere from four to eight bits (sufficient to count to 16 or 256) would be sufficient to carry out the counting function. The outputs of the register and the counter feed an XOR gate 46 that subsequently generates an output to one of two inputs to an AND gate 48. The other AND gate input receives the sync-reject information directly. The output of the AND gate feeds one of the inputs to the OR gate 34 (FIG. 1).

The construction of the fail array logic 20, with the interrelationships between the sync-reject logic 24, the per-pin memory 30, and the disable logic 40, is preferably implemented as an application specific integrated circuit (ASIC). This provides distinct benefits for multi-channel constructions by substantially minimizing hardware space and cost.

In operation, the tester (not shown) drives test patterns developed by a pattern generator (not shown) to the input pins of the DUT 14 via an array of drivers (not shown). The DUT produces outputs at selected pins in response to the patterns that are captured by the comparators 16 corresponding to the pins. For a particular DUT pin output, such as at "PIN 0", the corresponding comparator 16 captures the actual DUT signal and determines the matching logic level (VOH and VOL) to generate a formatted signal for processing by one channel (channel 0) of the fail array logic 20.

The fail array 20 receives the formatted signal as an input to the sync-reject logic 24. The logic compares the formatted DUT data to the expected logic level for that DUT cycle and generates a sync-reject signal if a data mismatch is detected. The sync-reject signal is transmitted along parallel paths to the catchram (not shown), a delay path to the per-pin memory 30, and along the control data path 39 to the disable logic 40.

During a standard test run with little to no failures, few sync-reject signals propagate along the control data path 24 to the disable logic 40. Each failure signal is counted by the counter, with the running count compared to the threshold value for each occurrence. If the count remains under the threshold, a logic "1" is output to the AND gate 48 and ANDed with the actual sync-reject signal. The output from the AND gate is then delivered to the OR gate 34 for ORing with sync-reject signals from the other fail array channels. The ORed bitstream feeds the FVM controller 32 to generate a "store" command for the per-pin memory 30.

During the processing through the disable logic 40, the sync-reject signal fed along the delay path is held by a pipeline element 28, such as a first-in-first-out (FIFO) as is well known in the art. The delay is programmed for the number of cycles (approximately 50) needed for the disable logic processing and controller processing. If a write command issues from the FVM controller 32, the delayed failure signal is loaded into the per-pin memory 30 in sync with the application of the write signal to the per-pin memory.

In the case where a large number of failures are generated on a particular channel, the sync-reject signals are handled by the control data path 39 similar to that described above, and fed to the disable logic circuit 40. The multi-bit counter 44 detects each fail signal and increments a running count for comparison by the XOR gate 46 to the programed threshold value generated by the register 42. When the counter reaches the level of the programmed threshold, the XOR gate generates a low logic signal, causing the AND gate 48 to inhibit further delivery of failure signals from that particular channel to the OR gate 34. The remaining "enabled" channels continue to deliver failure control information via the collective OR gate 34 to the FVM controller 32.

At the conclusion of a test, the FVM data is analyzed in conjunction with one or more failure analysis systems (not shown) to assist in determining the acceptability of the DUT and/or the causes of the detected failures. A thorough and fast determination of consistent failures is important to rectify a possible problem upstream in the manufacturing process to minimize any further loss of semiconductor yields.

Those skilled in the art will appreciate the many benefits and advantages afforded by the present invention. Of particular importance is the disable logic feature that selectively inhibits data delivery along a data path to the FVM controller. By utilizing the ability to detect unusually large failure streams, the per-pin memory capacity is preserved for failure information relating to other channels. This feature, in-turn, also minimizes the risk of lost data that might occur should the FVM wrap-around.

While the invention has been particularly shown and described with reference to the preferred embodiments thereof, it will be understood by those skilled in the art that various changes in form and detail may be made therein without departing from the spirit and scope of the invention.

What is claimed is:

1. A memory control circuit for use in a data path of a failure capture circuit to selectively control the storage of failure information associated with a pin of a device-under-test, said memory control circuit including:

a memory controller operative to generate a store signal in response to a failure control signal;

a semiconductor memory having a control input coupled to said controller for receiving said store signal, and operative in response to said store signal to write failure information associated with a particular failure control signal; and disable logic operative according to predetermined conditions for selectively inhibiting the delivery of said failure control signals to said memory controller.

2. A memory control circuit according to claim 1 wherein: said semiconductor memory comprises a per-pin RAM.

3. A memory control circuit according to claim 1 wherein said disable logic includes:

a counter coupled to said data path to generate a count representing the number of fail control signals delivered along said path;

a programmable register for storing a representation of a threshold number of fails;

a comparator configured to receive and compare said count to said threshold number of fails and operative to generate an enable signal when said count is less that said threshold number, and a disable signal when said count is equal to or greater than said threshold number; and gating circuitry coupled to said comparator and operative, when enabled by said enable signal, to pass said failure control signal to said controller.

4. A memory control circuit according to claim 3 wherein: said gating circuitry is operative, when disabled by said disable signal, to inhibit said failure control signal from passing to said controller.

5. A failure capture circuit for use in a semiconductor tester for capturing and processing output signals generated by a device-under-test, said failure capture circuit including:

capture logic for capturing output pin data from said device-under-test;

fail array logic for processing said output pin data, said fail array logic including a plurality of channels corresponding to said DUT pins, each channel including failure detection logic for identifying failures in said captured pin data and generating failure signals representing said identified failures, per-pin memory for storing failure information associated with said identified failures, said memory including a control signal input, disable logic coupled to said failure detection logic for selectively inhibiting propagation of said failure signals; and a memory controller coupled to said disable logic for generating store command signals to said memory control signal input in response to receiving failure signals selectively passed by said disable logic.

6. A failure capture circuit according to claim 5 wherein: said capture logic includes an array of comparators, each comparator corresponding to a pin of said device-under-test.

7. A failure capture circuit according to claim 5 wherein: said failure detection logic comprises sync-reject logic, and said failure signals comprise sync-reject signals generated by said sync-reject logic.

8. A failure capture circuit according to claim 5 wherein: said fail array logic comprises an integrated circuit.

9. A failure capture circuit according to claim 5 wherein:
said per-pin memory includes a capacity sufficient to store a coded signal representative of said pin pass/fail state, and said channel state.

10. A failure capture circuit according to claim 5 and further including:
a delay path for delaying failure data a predetermined duration until said controller issues said write signal.

11. A failure capture circuit according to claim 5 and further including:
gating circuitry for collecting failure signals from said plurality of channels and transforming said multi-channel failure signals into a bitstream for application to said controller.

12. A method of controlling the storage of failure information in a failure vector memory, said memory controlled by a memory controller responsive to failure control signals, said method including the steps of:
identifying failures relating to a pin of a device-under-test;
generating failure control signals indicative of said detected failures;
routing said failure control signals to said memory controller; and
selectively disabling said routing step when the number of said failure control signals reaches a predetermined level.

13. A method according to claim 12 wherein said selectively disabling step includes the steps of:
selecting a threshold value;
counting the number of fails in said failure information to incrementally generate a running count;
comparing said running count to said threshold value; and
inhibiting delivery of said failure control information to said memory when said running count meets or exceeds said threshold value.

14. A failure analysis circuit for use in a semiconductor tester for capturing and processing output signals generated by a plurality of device-under-test pins, the device-under-test having a memory array, the failure analysis circuit including:
a failure analysis memory having memory cells corresponding to the device-under-test memory array;
a plurality of channels coupling the failure analysis memory to the plurality of device-under-test pins, each of the channels corresponding to one of the plurality of device-under-test pins, each of the channels including a memory control circuit having
a memory controller operative to generate a store signal in response to a failure control signal;
a semiconductor memory having a control input coupled to the controller for receiving the store signal, and operative in response to the store signal to write failure information associated with a particular failure control signal, and
disable logic operative according to predetermined conditions for selectively inhibiting the delivery of the failure control signals to the memory controller.

* * * * *